US012658915B2

(12) United States Patent
Liao et al.

(10) Patent No.: US 12,658,915 B2
(45) Date of Patent: Jun. 16, 2026

(54) BIDIRECTIONAL GaN FET WITH SINGLE GATE

(71) Applicant: Efficient Power Conversion Corporation, El Segundo, CA (US)

(72) Inventors: Wen-Chia Liao, Torrance, CA (US); Jianjun Cao, Torrance, CA (US); Robert Beach, La Crescenta, CA (US); Zhikai Tang, Torrance, CA (US); Edward Lee, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 585 days.

(21) Appl. No.: 17/961,619

(22) Filed: Oct. 7, 2022

(65) Prior Publication Data

US 2023/0111542 A1      Apr. 13, 2023

Related U.S. Application Data

(60) Provisional application No. 63/253,641, filed on Oct. 8, 2021.

(51) Int. Cl.
*H03K 17/687* (2006.01)
*H10D 8/01* (2025.01)
(Continued)

(52) U.S. Cl.
CPC ......... *H03K 17/6871* (2013.01); *H10D 8/051* (2025.01); *H10D 62/8503* (2025.01); *H10D 64/111* (2025.01)

(58) Field of Classification Search
CPC ...... H10D 8/051; H10D 62/10; H10D 62/824;

H10D 62/8503; H10D 64/111; H10D 64/112; H10D 64/251; H10D 64/257; H10D 64/258; H10D 64/311; H10D 64/518; H10D 64/519; H10D 64/62; H10D 30/471;
(Continued)

(56) References Cited

U.S. PATENT DOCUMENTS 6,965,253 B1    11/2005    Chen et al.
7,465,997 B2    12/2008    Kinzer et al.
(Continued)

FOREIGN PATENT DOCUMENTS

CN       202110867195.X    *    7/2021    .........    H01L 27/0629
CN              114402434 A          4/2022
(Continued)

OTHER PUBLICATIONS

Zhang et al. High electron mobility transistor HEMT device, wafer packaging device, and electronic device, 2022, machine translation of WO 2022068835A1, pp. 1-32. (Year: 2022).*
(Continued)

*Primary Examiner* — Natalia A Gondarenko
(74) *Attorney, Agent, or Firm* — Blank Rome LLP

(57)       ABSTRACT

A bidirectional GaN FET with a single gate formed by integrating a single-gate bidirectional GaN FET in parallel with a bidirectional device formed of two back-to-back GaN FETs with a common source. The single-gate bidirectional GaN FET occupies most of the integrated circuit die, such that the integrated device has a low channel resistance, while also capturing the advantages of a back-to-back bidirectional GaN FET device.

10 Claims, 18 Drawing Sheets

(51) Int. Cl.
　　*H10D 62/85*　　　(2025.01)
　　*H10D 64/00*　　　(2025.01)
(58) Field of Classification Search
　　CPC .... H10D 30/474; H10D 30/475; H10D 64/20;
　　　　　H10D 64/23; H10D 64/27; H10D 64/411;
　　　　　H10D 64/512; H10D 84/82; H10D 84/83;
　　　　　　H10D 84/8311; H10D 84/8312; H10D
　　　　　　84/83125; H10D 84/83138; H10D
　　　　　84/833; H10D 89/811; H03K 2217/0009;
　　　　　H03K 2217/0018; H03K 17/08104; H03K
　　　　　17/6871; H03K 17/785; H01L 23/28;
　　　　　H01L 23/3171; H01L 23/3192; H01L
　　　　　29/122; H01L 29/127; H01L 29/15; H01L
　　　　　29/158; H01L 29/42316; H01L 29/6656;
　　　　　H01L 29/66431; H01L 29/66462; H01L
　　　　　29/6653; H01L 29/66719; H01L 29/778;
　　　　　H01L 29/7789; H01L 29/7816; H01L
　　　　　29/808; H01L 2924/13064
　　USPC ............................. 257/77, 76, 288, 192, 194
　　See application file for complete search history.

(56)　　　　　　　References Cited

U.S. PATENT DOCUMENTS

| | | | |
|---|---|---|---|
| 7,875,907 B2 | 1/2011 | Honea et al. | |
| 8,604,512 B2 | 12/2013 | Morita | |
| 8,890,168 B2 | 11/2014 | Lidow et al. | |
| 9,048,837 B2 | 6/2015 | Hirose et al. | |
| 9,761,284 B1 | 9/2017 | Hulub et al. | |
| 9,847,394 B2 | 12/2017 | Prechtl et al. | |
| 10,033,296 B1 * | 7/2018 | Lee ....................... H02M 7/217 | |
| 10,128,228 B1 * | 11/2018 | Gao ..................... H10D 62/824 | |
| 2006/0071295 A1 | 4/2006 | Chang | |
| 2010/0259321 A1 | 10/2010 | Tserng et al. | |
| 2012/0153300 A1 * | 6/2012 | Lidow ................... H01L 23/535 | |
| | | | 257/77 |

| | | | |
|---|---|---|---|
| 2012/0280280 A1 * | 11/2012 | Zhang ................. H10D 30/475 | |
| | | | 257/E21.403 |
| 2014/0087673 A1 | 3/2014 | Mostov et al. | |
| 2014/0374766 A1 | 12/2014 | Bahl et al. | |
| 2015/0014701 A1 | 1/2015 | Briere | |
| 2016/0218189 A1 * | 7/2016 | Oasa .................... H10D 64/112 | |
| 2017/0103978 A1 | 4/2017 | Prechtl et al. | |
| 2018/0374943 A1 * | 12/2018 | Liu ...................... H10D 62/824 | |
| 2019/0207590 A1 * | 7/2019 | Lueders ............. H03K 17/0822 | |
| 2021/0408273 A1 * | 12/2021 | Wu ................... H01L 23/49562 | |
| 2023/0111542 A1 | 4/2023 | Liao et al. | |
| 2024/0170979 A1 * | 5/2024 | Zhang ................. H02J 7/00308 | |

FOREIGN PATENT DOCUMENTS

| | | | | |
|---|---|---|---|---|
| DE | 102015117394 B2 | 6/2020 | | |
| EP | 3 562 040 A1 | 10/2019 | | |
| EP | 4 362 266 A1 | 5/2024 | | |
| JP | 2020 068215 A | 4/2020 | | |
| JP | 7128715 B2 | 8/2022 | | |
| TW | 2013/01758 A | 1/2013 | | |
| TW | 201521360 A | 6/2015 | | |
| WO | WO-2022068835 A1 * | 4/2022 | .......... H10D 30/015 | |

OTHER PUBLICATIONS

International Search Report and Written Opinion dated Jan. 16, 2023 from corresponding PCT/US2022/077731.
T. Morita et al., "650 V 3.1m'Ωcm² GaN-based Monolithic Bidirectional Switch Using Normally-off Gate Injection Transistor", 2007 IEEE International Electron Devices Meeting, 2007, pp. 865-868, doi: 10.1109/IEDM.2007.4419086.
Y. Shi et al., "A GaN enhancement-mode reverse blocking MISHEMT with MIS field-effect drain for bidirectional switch", *J Comput Electron*, vol. 17, pp. 238-245 (2018).
Y. Shi et al., "A non-Ohmic normally-off GaN monolithic bidirectional switch with MIS field effect schottky tunnel junction", *Superlattices and Microstructures*, vol. 109, pp. 414-422 (2017).

* cited by examiner

BIDIRECTIONAL GaN FET WITH SINGLE GATE

This application claims the benefit of U.S. Provisional Application No. 63/253,641, filed on Oct. 8, 2021, the entire disclosure of which is hereby incorporated by reference.

FIELD OF THE INVENTION

The present invention relates generally to a switch, and more particularly to a bidirectional GaN field effect transistor (FET) switch.

BACKGROUND

An enhancement mode GaN FET is naturally bidirectional—i.e., it conducts current in both directions. However, the voltage blocking capability of a GaN FET is non-symmetric—the drain can block high voltages, while the source can only block low voltages.

Back-to-back GaN FETs with dual gates, such as disclosed in U.S. Pat. No. 8,604,512, have the capability to conduct current and block equally high voltage in either direction. However, the current flowing through the device must flow under two gates (i.e., the current flows under the gate of the first FET and the gate of the second FET), which can undesirably increase the channel resistance ($R_{DS(ON)}$).

A single gate bidirectional GaN FET is disclosed in U.S. Pat. No. 7,465,997, but this device has a floating substrate, which can cause threshold voltage shift and dynamic $R_{DS(ON)}$.

Accordingly, it would be desirable to have a single gate bidirectional GaN FET with the substrate either at source or gate potential (i.e., not floating).

SUMMARY OF THE INVENTION

The present invention overcomes the above-noted disadvantages of the prior art and achieves the objective noted above by providing a device in which a single-gate bidirectional GaN FET is integrated on a single die in parallel with a bidirectional device formed of two back-to-back GaN FETs with a common source. The single-gate bidirectional GaN FET occupies most of the area of the integrated circuit die, such that the integrated device has the low channel resistance of a single gate device without the above-noted disadvantages of a conventional single gate bidirectional GaN FET device.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings, in which like reference characters identify correspondingly throughout and wherein:

FIG. 14 is a cross-sectional view of the first sub-switch of the bidirectional enhancement mode GaN switch of FIG. 13, with gate protection circuitry.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed, and that various structural, logical, and electrical changes may be made.

Figure 1:
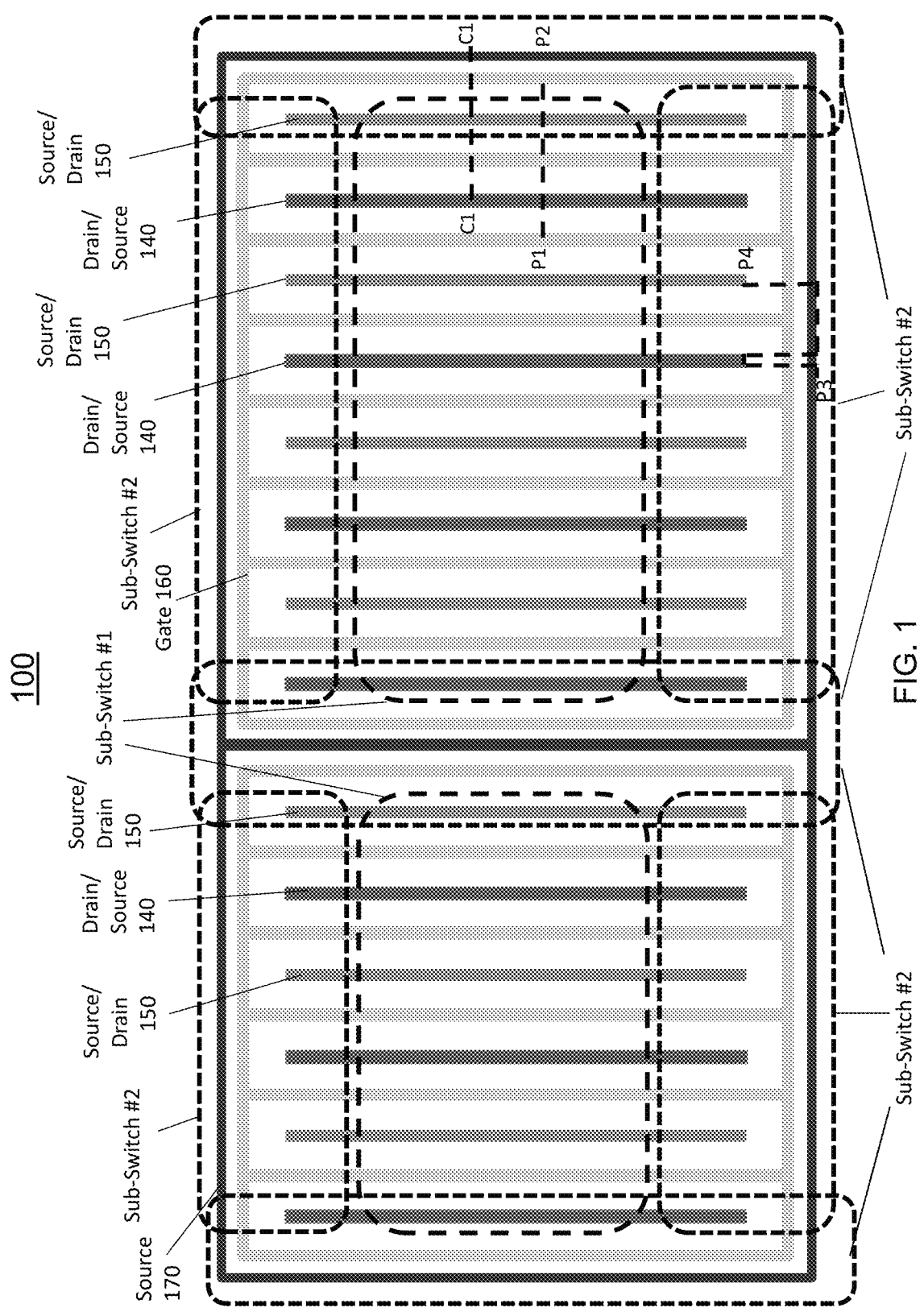
FIG. 1 illustrates a top view of the bidirectional enhancement mode GaN switch of the present invention, including first and second sub-switches.
Figure 1A:
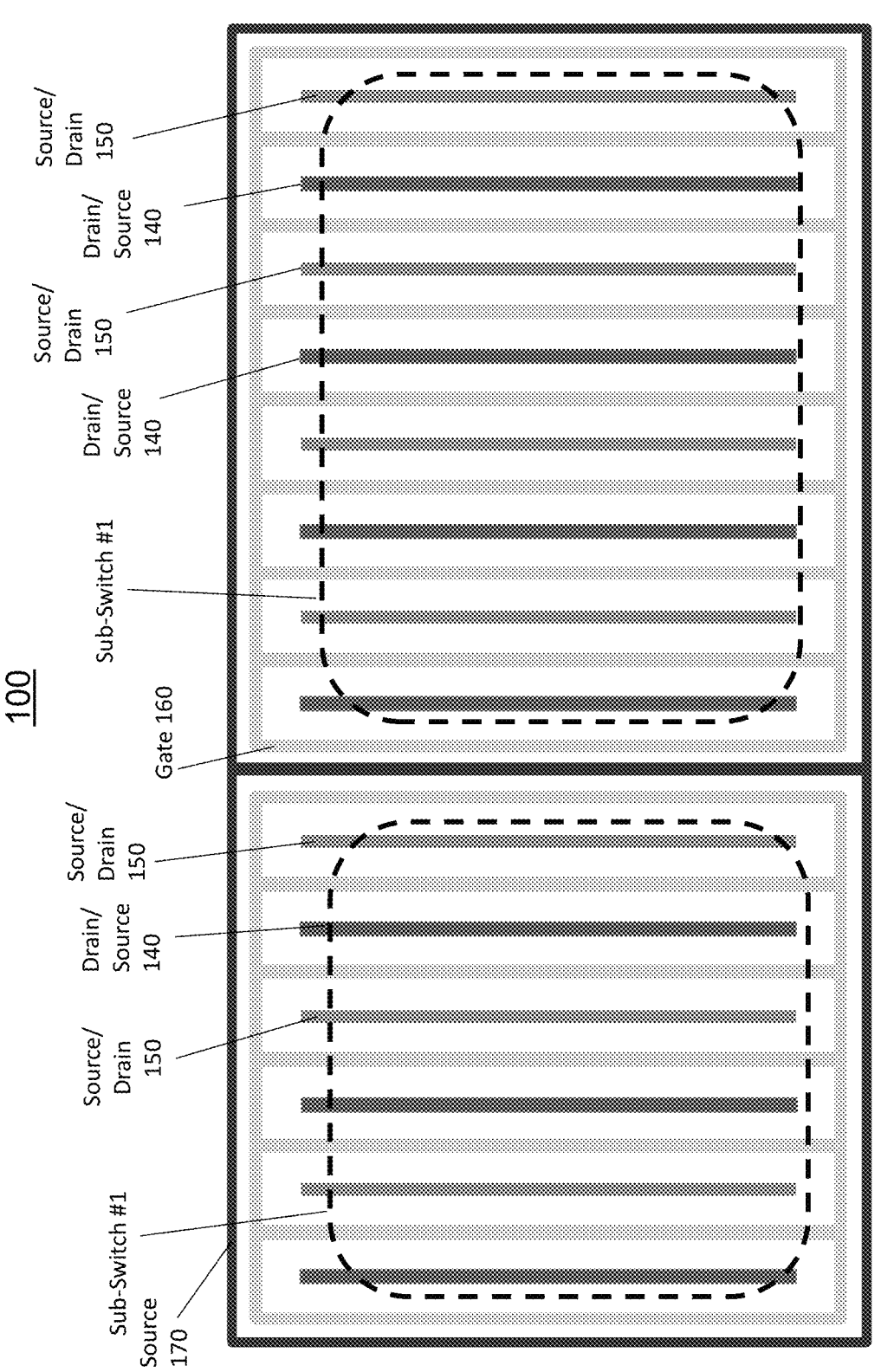
FIGS. 1A and 1B illustrate, respectively, a top view of the first sub-switch and a top view of the second sub-switch.
Figure 1B:
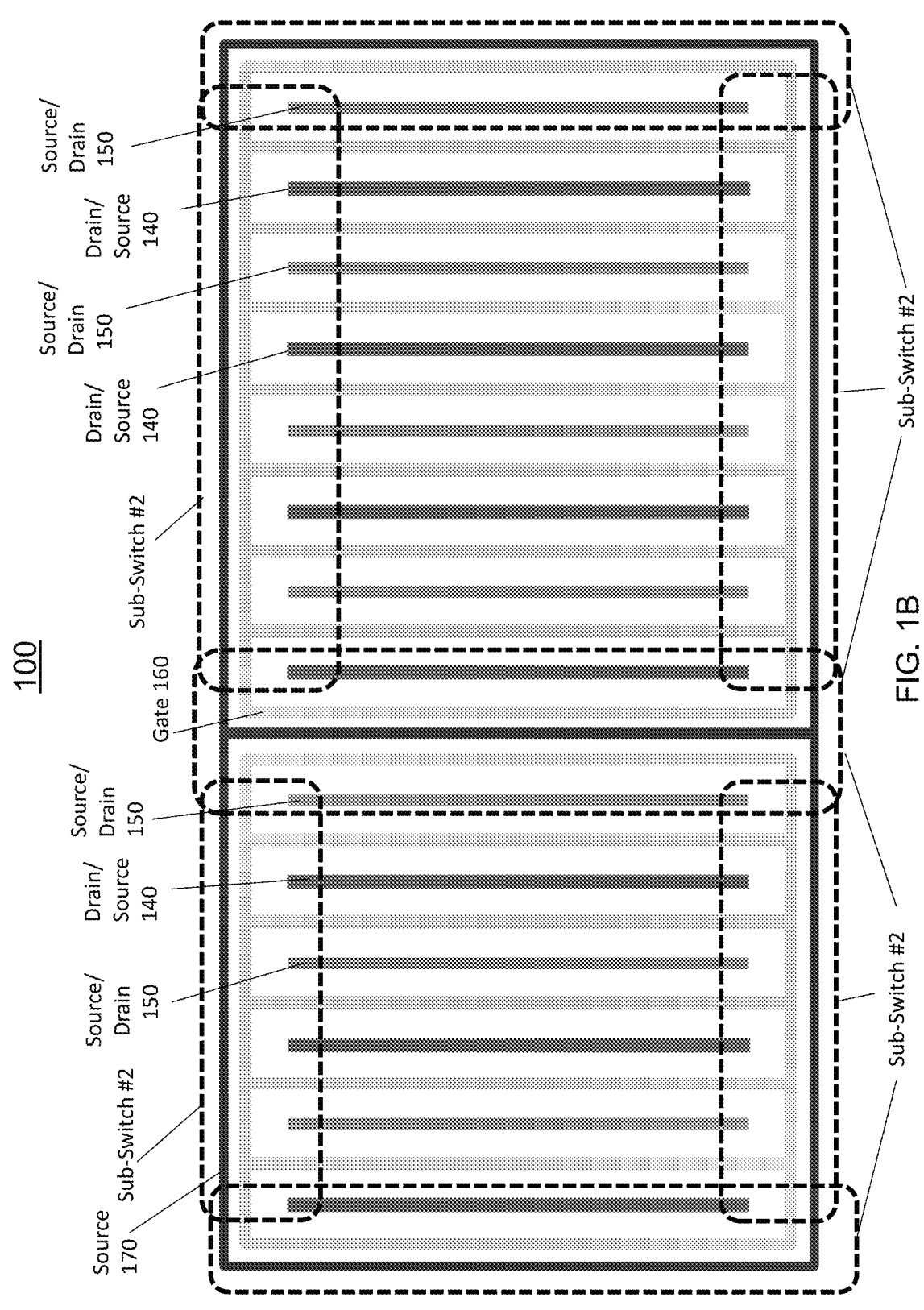
Figure 2:
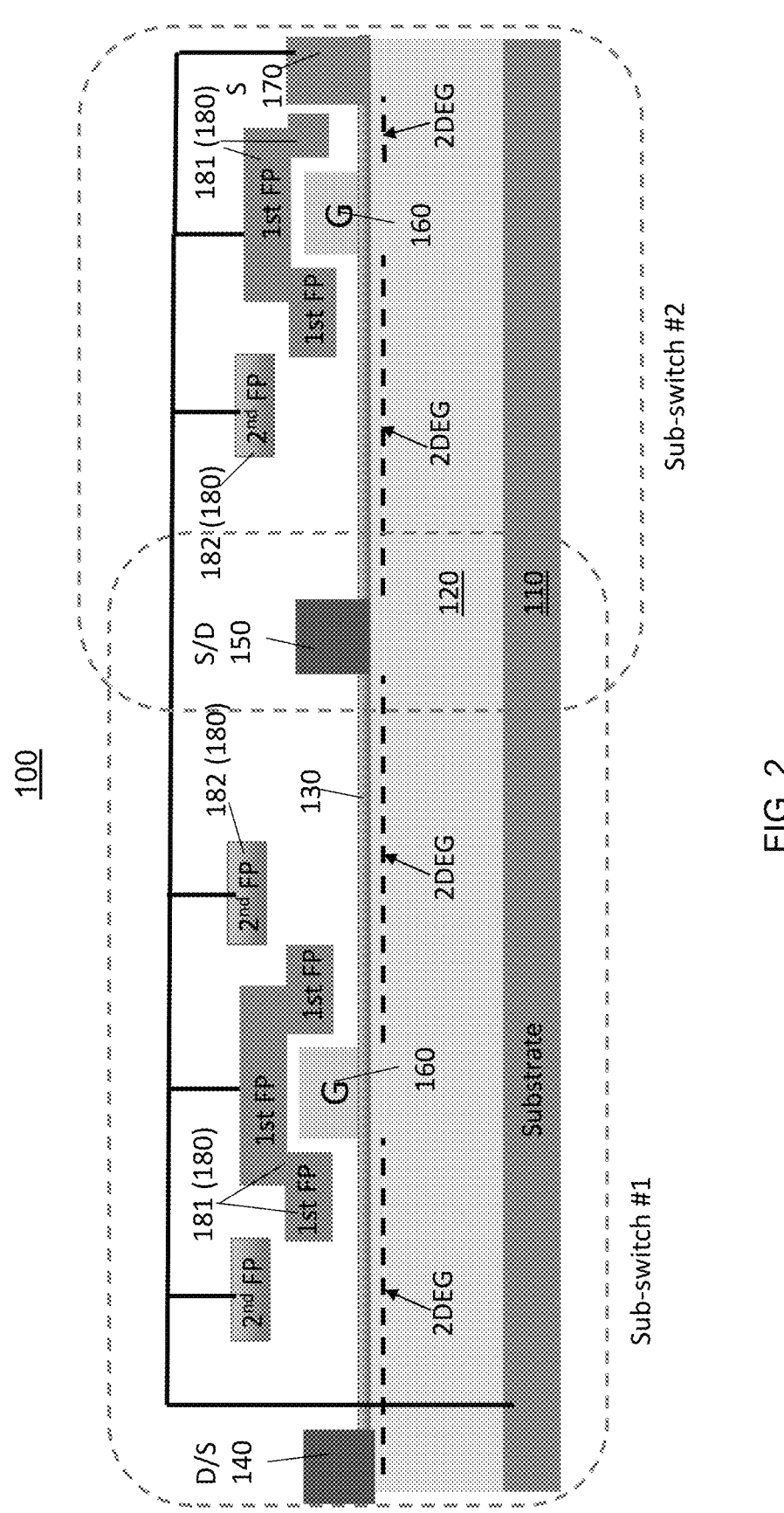
FIG. 2 is a cross-sectional view of a first embodiment of the bidirectional enhancement mode GaN switch of the present invention.
Figures 3A, 3B, 3C:
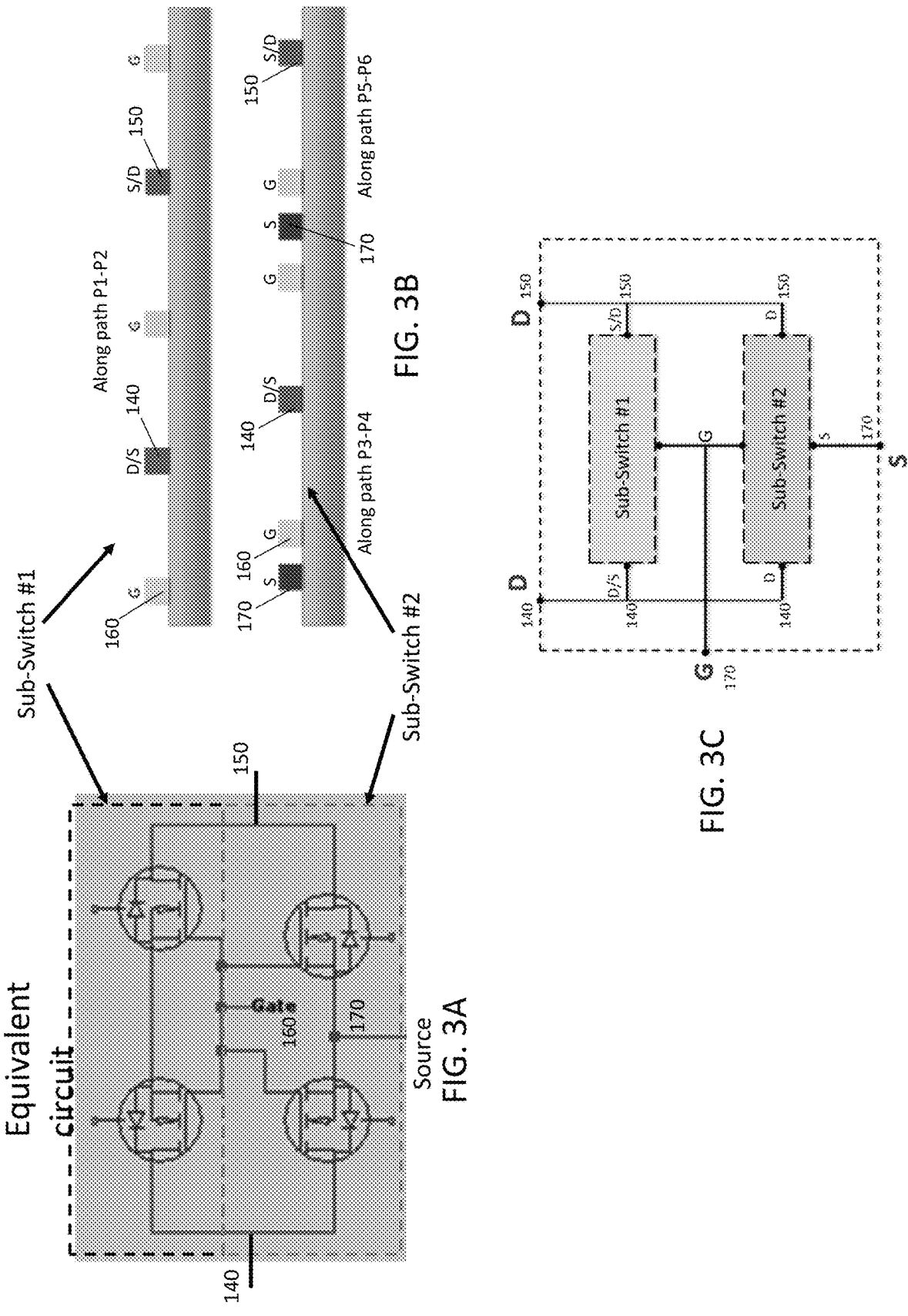
FIGS. 3A and 3C illustrate an equivalent circuit and a block diagram of the bidirectional enhancement mode GaN switch.
FIG. 3B is a schematic illustration of the two sub-switches of the bidirectional enhancement mode GaN switch.

FIGS. 1 and 2 illustrate a top view and a cross-sectional view, respectively, of a bidirectional enhancement mode GaN switch 100 including two sub-switches in accordance with a first embodiment of the present invention. FIG. 2 is a cross-sectional view across C1-C1 in FIG. 1. FIGS. 3A and 3C illustrate an equivalent circuit and a block diagram of bidirectional enhancement mode GaN switch 100, respectively; and FIG. 3B shows a schematic illustration of two sub-switches of bidirectional enhancement mode GaN switch 100.

Switch 100 is formed of two sub-switches, i.e., first and second sub-switches (sub-switches #1 and #2, respectively). Sub-switch #1 is comprised of a single gate GaN FET, while sub-switch #2 is comprised of two back-to-back GaN FETs. Sub-switch #1 and sub-switch #2 are integrated together in a single device, thereby capturing the benefits of both, as described more fully below. With reference to FIG. 1, in an actual implementation of the present invention, sub-switch #1 occupies most of the die area, while sub-switch #2 takes up only a small percentage of the die area.

Switch 100 includes a substrate 110, a GaN layer 120 on the substrate 110, an AlGaN layer 130 on the GaN layer 120, a first ohmic power electrode 140 and a second ohmic power electrode 150 that have sub-electrodes arranged alternately, a third ohmic power electrode 170, and a gate 160. The first ohmic power electrode 140 and the second ohmic power electrode 150 serve as source/drain electrodes (S/D or D/S, depending upon the direction of current flow) of the first sub-switch. The first ohmic power electrode 140 and the second ohmic power electrode 150 also serve as the source/drain electrodes (S/D or D/S, depending upon the direction of current flow) of the two back-to-back field-effect transistors (FETs) of the second sub-switch; and the third ohmic power electrode 170 operates as a common source electrode of the two back-to-back FETs of the second sub-switch.

In the first sub-switch, the gate 160 is spaced an equal distance from the first and second ohmic power electrodes 140, 150 to achieve symmetry in voltage blocking capability. That is, the gate 160 is centrally located with respect to the adjacent first and second ohmic power electrodes 140, 150. Accordingly, the first sub-switch can block high voltage equally in either direction (current flow from 140 to 150, or from 150 to 140). The second sub-switch, with back-to-back FETs, can also block high voltages equally in both directions. Accordingly, switch 100 of the present invention is a bidirectional enhancement-mode GaN switch that can block the same voltage regardless of which ohmic power electrode 140, 150 is at a higher potential.

Figure 6:
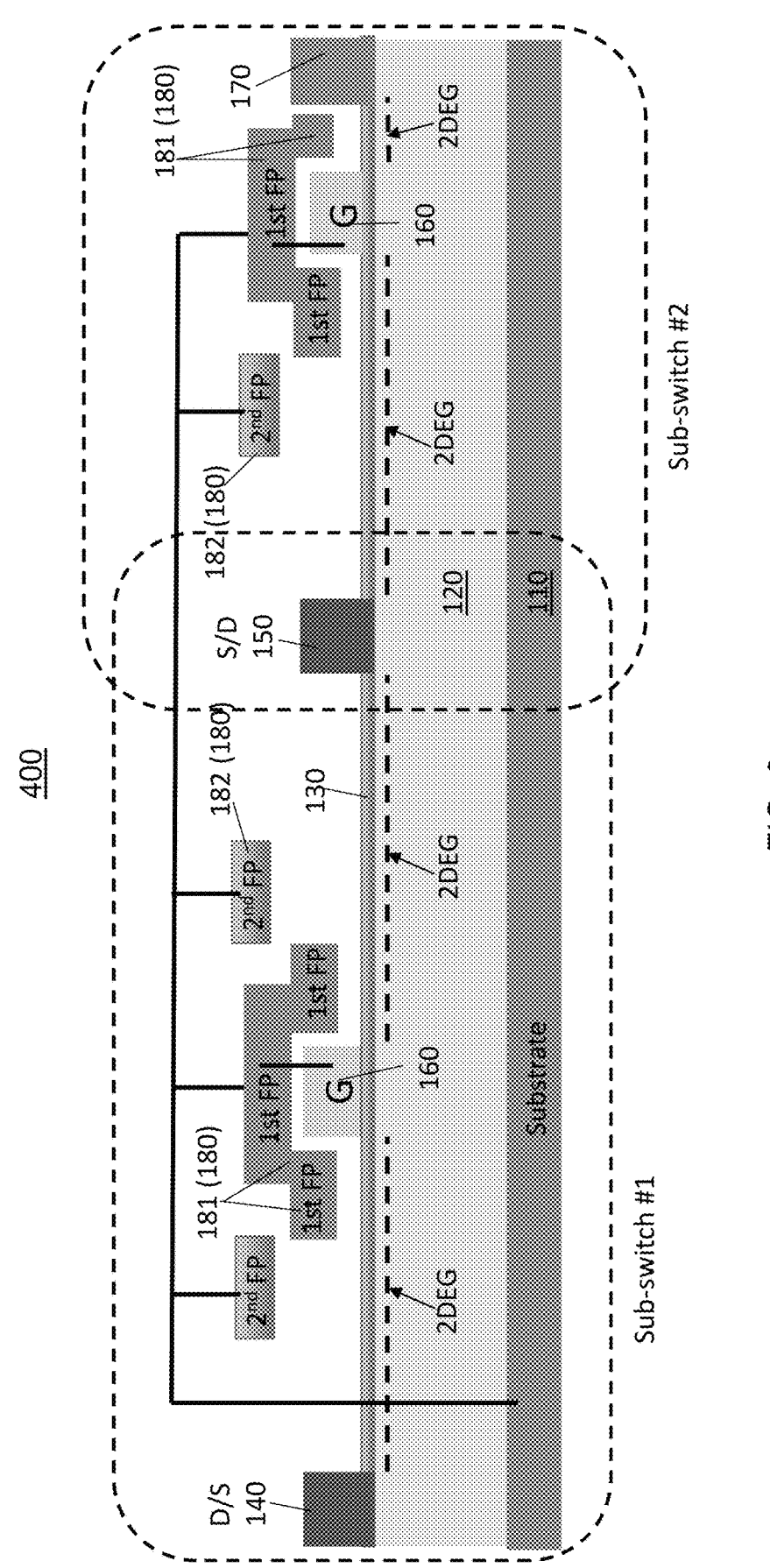
FIG. 6 is a cross-sectional view of a fourth embodiment of the bidirectional enhancement mode GaN switch of the present invention.

In the first sub-switch, not only can high voltage be blocked equally in both directions of current flow (from 140 to 150, or from 150 to 140), but, in addition, the current advantageously flows under only one gate. Since the first sub-switch occupies most of the die, by integrating the first sub-switch with the second switch, the channel resistance ($R_{DS(ON)}$) of switch 100 is significantly reduced, as compared to a bidirectional switch containing only back-to-back FETs. The third ohmic power electrode 170, as a common source electrode of the second sub-switch, may be left floating (as shown in FIG. 6), or used as a reference to drive the gate 160, or connected to a Zener diode or other gate protection circuit to protect the gate, depending upon the application scenario. By integrating the first sub-switch with the second sub-switch, switch 100 has the advantages of both sub-switches, i.e., reduced channel resistance and a reference to drive the gate 160.

Referring to FIG. 2, the first embodiment, the device of the present invention has four terminals: gate 160, D/S 140, S/D 150 and source 170. Field plates 180 (comprising field plates 181 and 182) and substrate 110 are electrically shorted to the source 170 of sub-switch #2. Along the channel between ohmic power electrode 140 and ohmic power electrode 150 of sub-switch #1, there is only one gate. Accordingly, the channel resistance of sub-switch #1, which occupies most of the die, is reduced, as compared to a device having two gates.

As shown in FIG. 3A, first and second sub-switches are connected in parallel in the equivalent circuit. The upper portion of FIG. 3B is the schematic illustration of the first sub-switch along the path P1-P2 as marked in FIG. 1, which shows that, between the first ohmic power electrode 140 and the second ohmic power electrode 150, the first sub-switch has a source-gate-drain or drain-gate-source configuration, depending upon the direction of current flow. The lower portion of FIG. 3B is the schematic illustration of the second sub-switch along the path P3-P4 as marked in FIG. 1, which shows that the second sub-switch has a drain-gate-source-gate-drain configuration between the first ohmic power electrode 140 and the second ohmic power electrode 150, i.e., back-to-back FETs with a common source.

Figure 4:
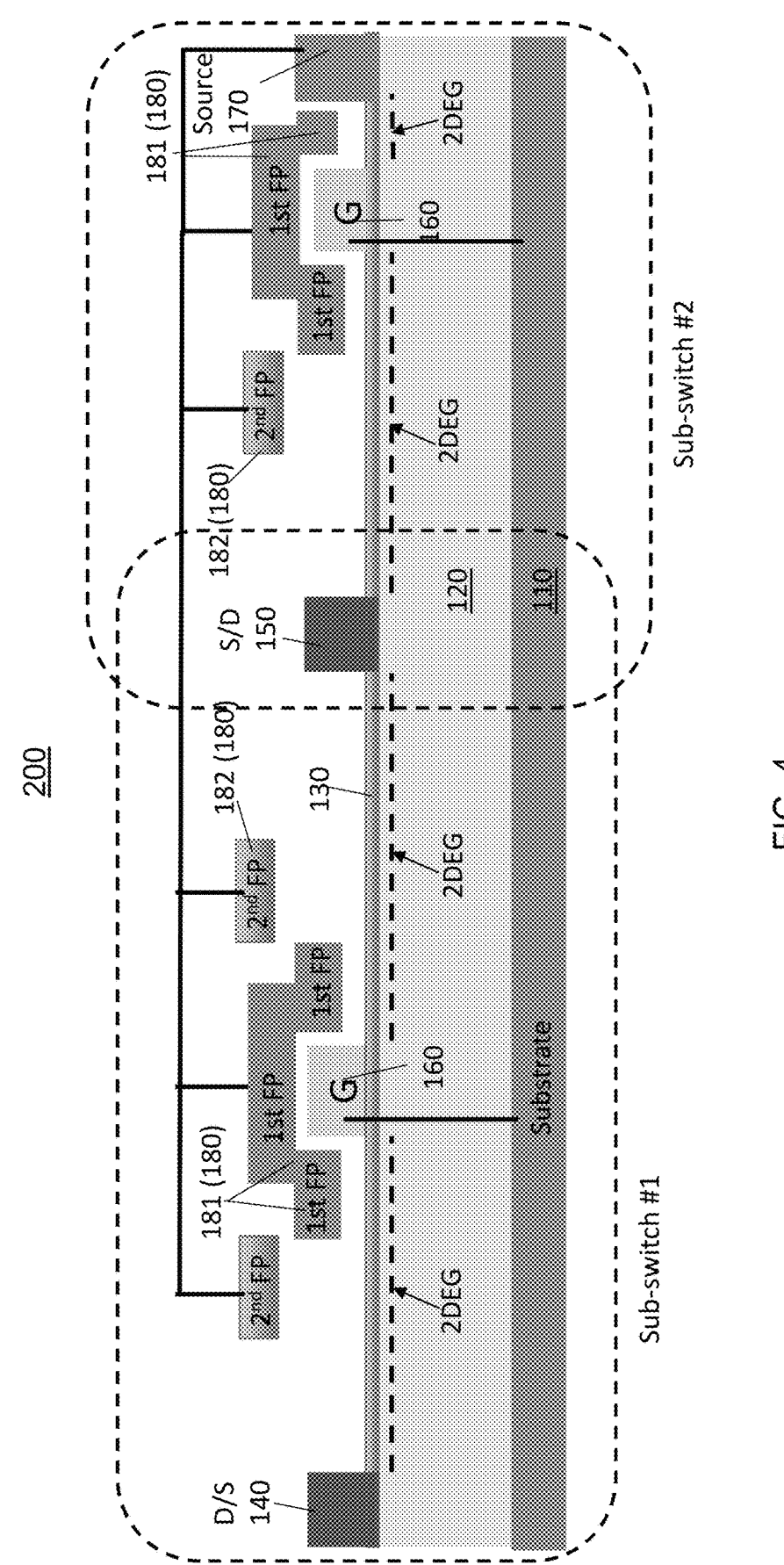
FIG. 4 is a cross-sectional view of a second embodiment of the bidirectional enhancement mode GaN switch of the present invention.

FIG. 4 illustrates a cross-sectional view of a second embodiment of the bidirectional enhancement mode GaN switch of the present invention. Switch 200 has four terminals: gate 160, D/S 140, S/D 150 and source 170. The field plates 180 (field plates 181 and 182) are shorted to source 170 of sub-switch #2.

Figure 5:
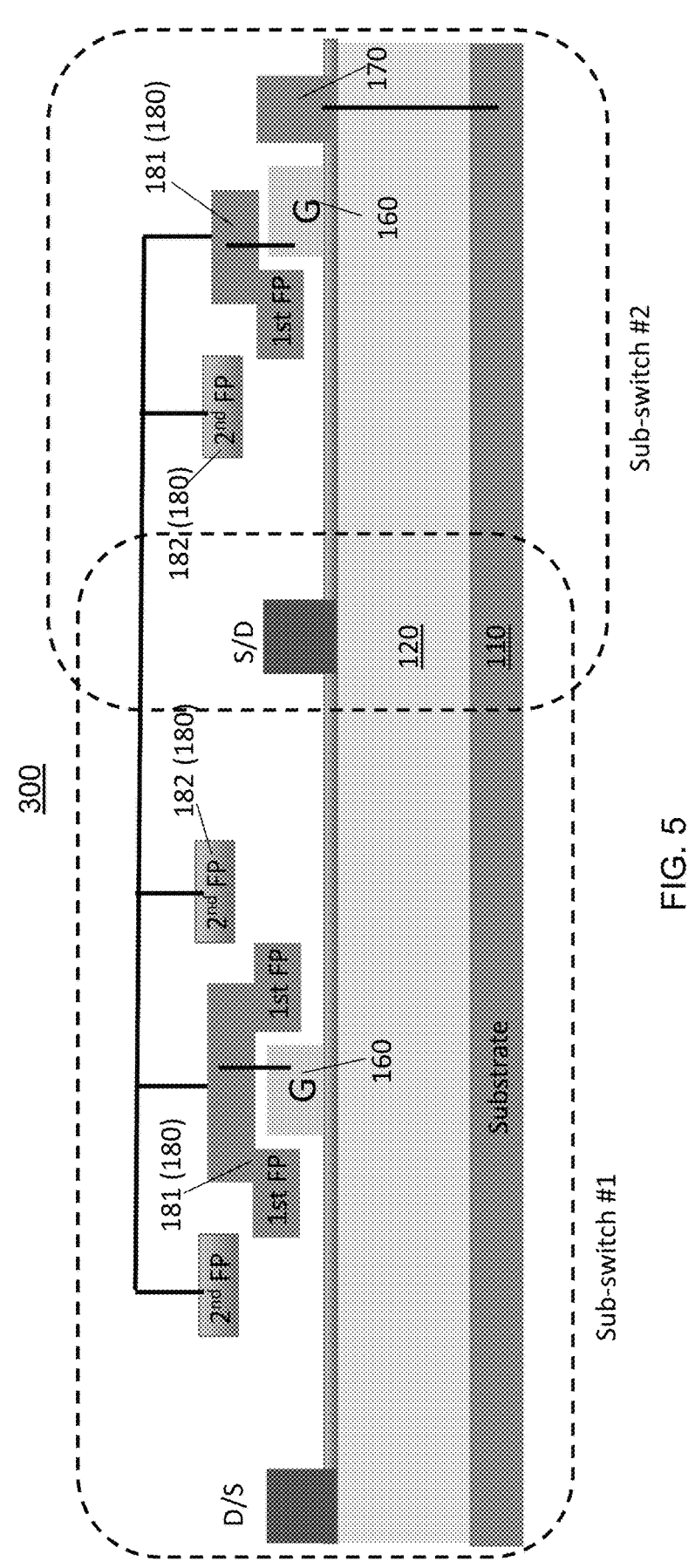
FIG. 5 is a cross-sectional view of a third embodiment of the bidirectional enhancement mode GaN switch of the present invention.

FIG. 5 illustrates a cross-sectional view of a third embodiment of the bidirectional enhancement mode GaN switch of the present invention. Switch 300 has four terminals: gate 160, D/S 140, S/D 150 and source 170. Field plates 180 are shorted to gate 160. Substrate 110 is shorted to source 170 of sub-switch #2.

FIG. 6 illustrates a cross-sectional view of a fourth embodiment 400 of the bidirectional enhancement mode GaN switch of the present invention. Switch 400 has three terminals: D/S 140, S/D 150 and gate 160. Source 170 is floating.

Figure 7:
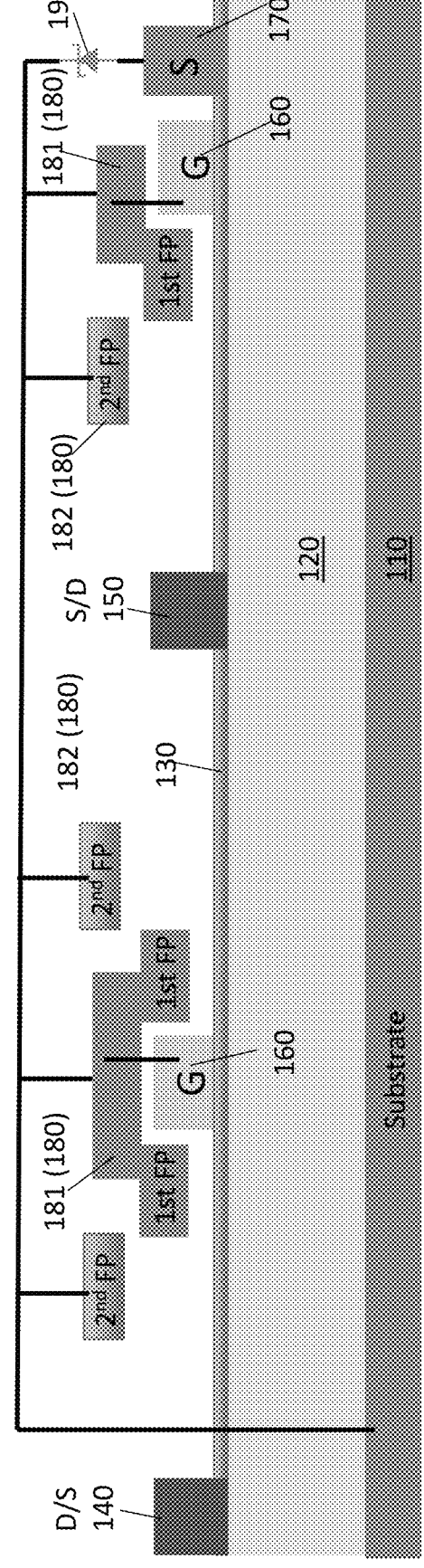
FIG. 7 is a cross-sectional view of a fifth embodiment of the bidirectional enhancement mode GaN switch of the present invention.

FIG. 7 illustrates a cross-sectional view of a bidirectional enhancement mode GaN switch 500 in accordance with a fifth embodiment of the present invention. Switch 500 is similar to switch 300 shown in FIG. 5, except that, in switch 300, a Zener diode 191 (or other suitable gate protection circuitry) is added between the gate 170 and the source 160 to protect the gate 170 from damage caused by an overvoltage. When the gate is subjected to an overvoltage, Zener diode 191 breaks down to protect the gate 170.

Figure 8:
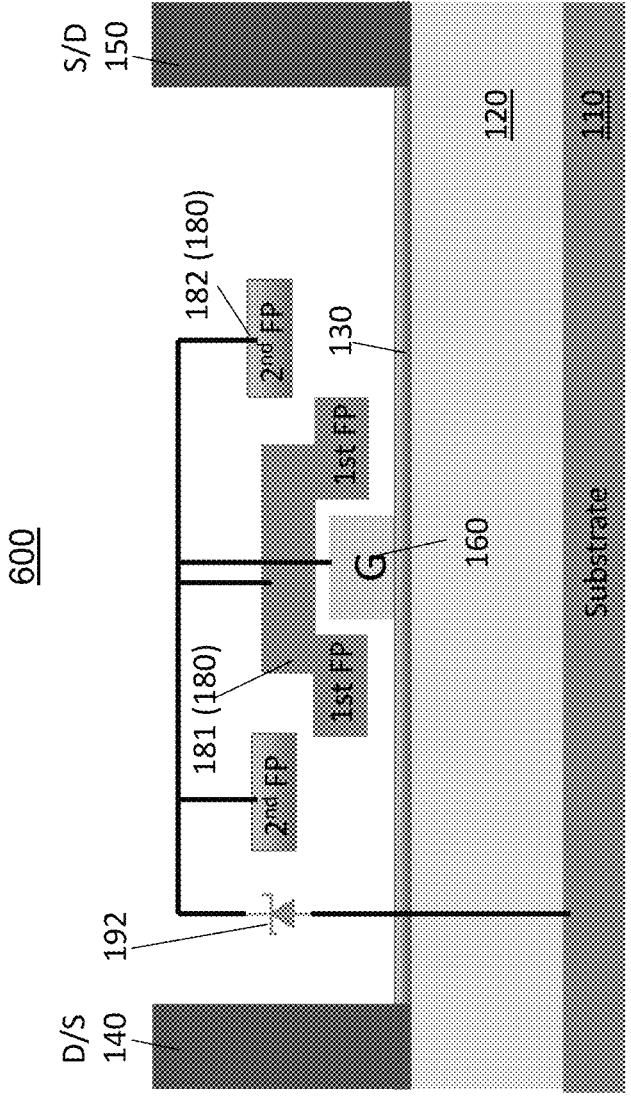
FIG. 8 is a cross-sectional view of a first sub-switch, i.e., a single gate GaN FET of a bidirectional enhancement mode GaN switch, in accordance with a sixth embodiment of the present invention.

FIG. 8 illustrates a cross-sectional view of a first sub-switch 600 in accordance with a sixth embodiment of the present invention. Switch 600 is similar to the first sub-switch of switch 400, except that, in sub-switch 600, a Zener diode 192 (or any other suitable gate protection circuitry) connected between gate 160 and substrate 110 protects gate 170 from damage caused by an overvoltage.

Figure 9:
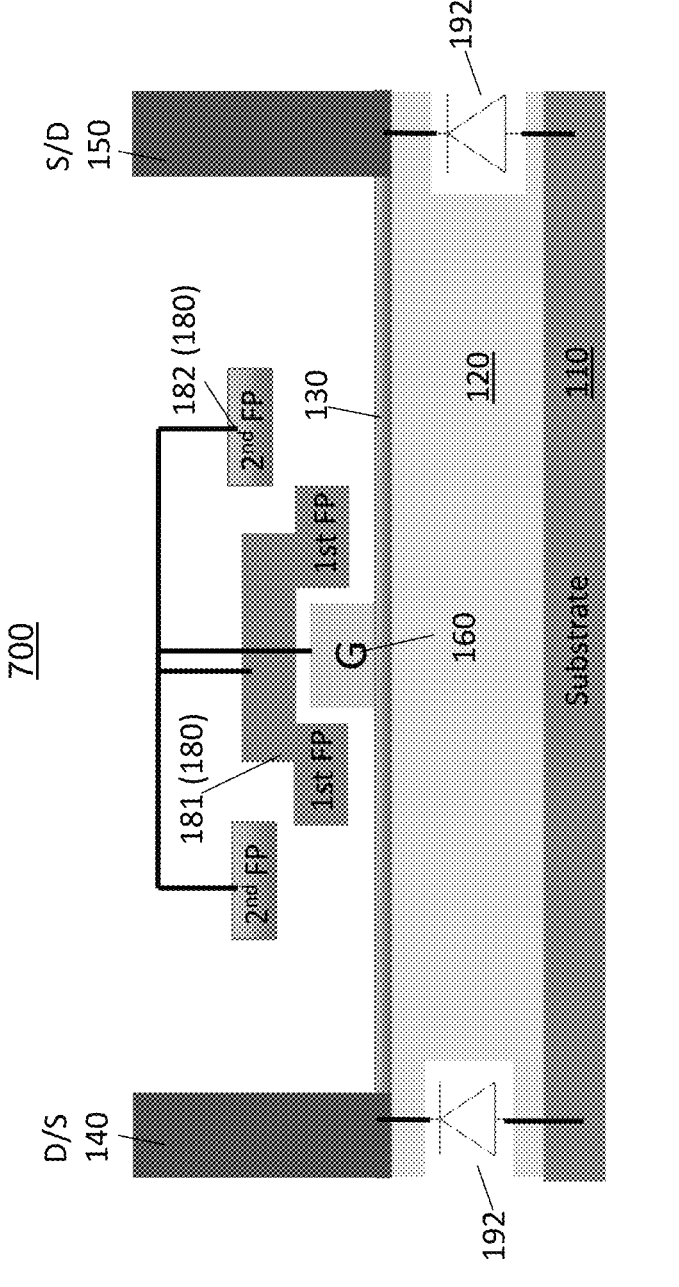
FIG. 9 is a cross-sectional view of a first sub-switch, i.e., a single gate GaN FET of a bidirectional enhancement mode GaN switch, in accordance with a seventh embodiment of the present invention.

FIG. 9 illustrates a cross-sectional view of a first sub-switch 700 in accordance with a seventh embodiment of the present invention. Sub-switch 700 is similar to sub-switch 600, except that, in sub-switch 700, substrate 110 is connected to the lower potential of either of the ohmic power electrodes 140, 150 by passive devices, such as diodes 192.

Figure 10:
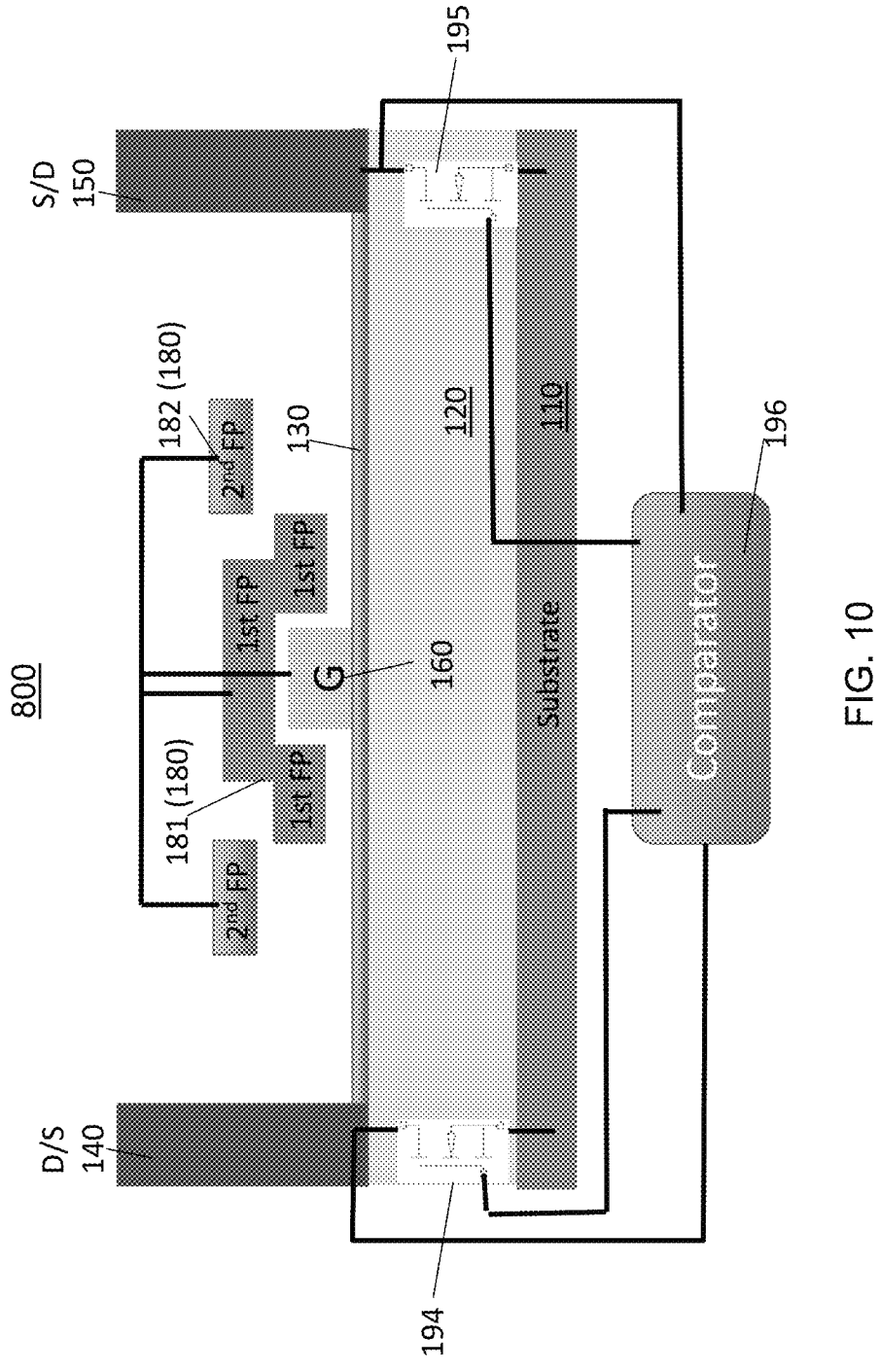
FIG. 10 is a cross-sectional view of a first sub-switch, i.e., a single gate GaN FET of a bidirectional enhancement mode GaN switch, in accordance with an eighth embodiment of the present invention.

FIG. 10 illustrates a cross-sectional view of a first sub-switch 800 in accordance with an eighth embodiment of the present invention. Sub-switch 800 is similar to sub-switch 600, except that, in the sub-switch 600, the substrate 110 is connected to the lower-potential one of the ohmic power electrodes 140, 150, by use of an active circuit. As shown in FIG. 10, the switch 800 further includes transistors 194, 195 and a comparator 196. Transistor 194 connects substrate 110 to ohmic power electrode 140 when the gate of the transistor 194 is turned on. Transistor 195 connects substrate 110 to ohmic power electrode 150 when the gate of the transistor 195 is turned on. Comparator 196 is electrically connected to the ohmic power electrodes 140 and 150, and gates of the transistors 194 and 195, to control the first and second transistors according to the potentials of the electrodes 140, 150. Comparator 196 compares the electrical potentials of ohmic power electrodes 140 and 150 to determine which one of the ohmic power electrodes 140 and 150 has a lower electrical potential, and turns on transistor 194 or transistor 195 in accordance with the determined lower-potential one of the ohmic power electrodes 140 and 150, and turns off the other transistor 194 or 195. Accordingly, substrate 110 is electrically connected to the lower-potential one of ohmic power electrodes 140 and 150.

Figure 11:
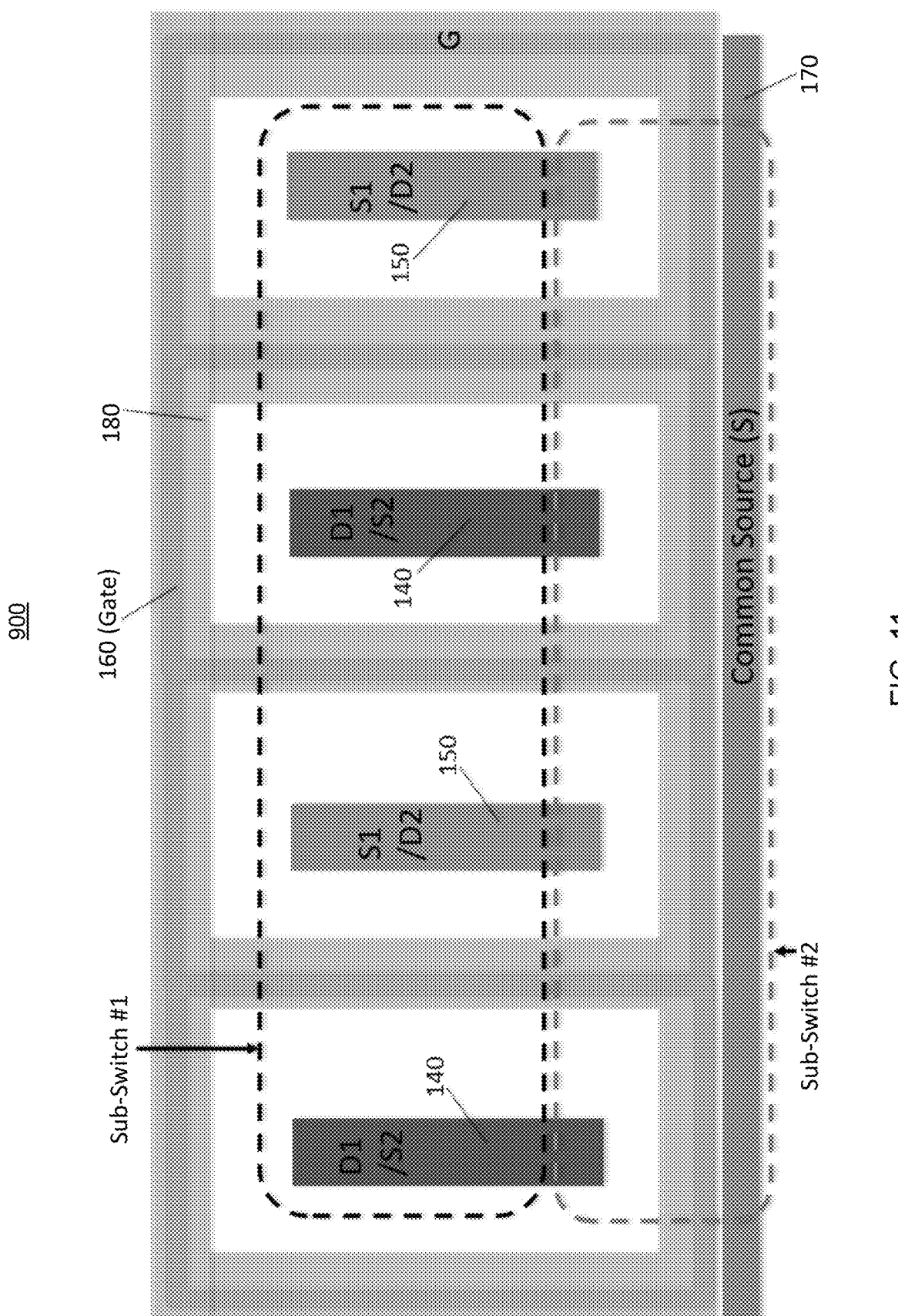
FIG. 11 is a top view of a bidirectional enhancement mode GaN switch including two sub-switches in a different layout.

FIG. 11 illustrates a top view of a bi-directional enhancement-mode GaN switch 900 including two sub-switches in accordance with another embodiment of the present invention. Similar to switch 100, switch 900 includes two sub-switches, i.e., first and second sub-switches (sub-switches #1 and #2, respectively). However, switch 900 has a different layout as compared to switch 100. For example, the common source 170 of switch 900 is at one side of the device, instead of occupying four sides of device in switch 100. Despite the differences in their layouts, switch 900 has the same equivalent circuit (FIG. 3A) and same block diagram (FIG. 3B) as the switch 100.

Figure 12:
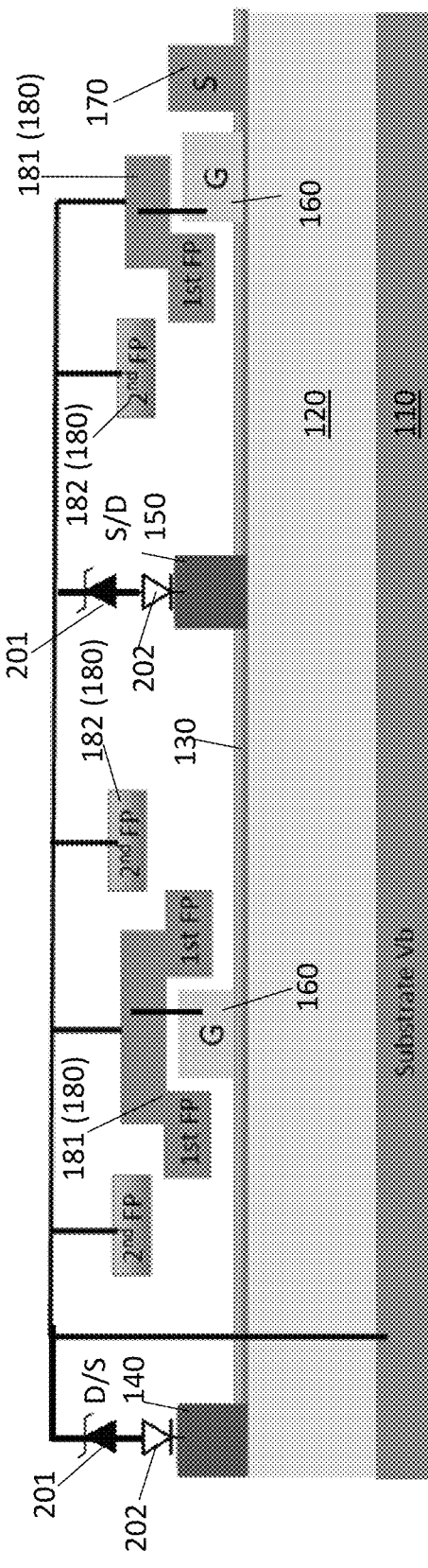
FIG. 12 is a cross-sectional view of a bidirectional enhancement mode GaN switch with gate protection circuitry.

FIG. 12 is a cross-sectional view of a bidirectional enhancement mode GaN switch, which is similar to bidirectional enhancement mode GaN switch 400 shown in FIG. 6, with certain differences described below. In FIG. 12, gate 160 is protected from overvoltage by two/dual Zener diodes 201 or other protection devices, each one of which is between the gate 160 and first ohmic power electrode 140 or between the gate 160 and the second ohmic power electrode 150. A diode 202 with a high breakdown voltage that is equal or larger than the breakdown voltage of the bidirectional switch is connected in series with the two Zener diodes 201 to increase the breakdown voltage of the device. A Schottky diode is preferred for its low forward voltage drop, high breakdown voltage, and easier integration in a GaN device platform compared to a pn diode. A high voltage GaN FET can be substituted for diode 201. The two back-to-back diodes 201, 202 in each drain-gate or source-gate path of the first sub-switch can be integrated, co-packed, and/or external. The third ohmic power electrode 170 (common source electrode) is floating, as in FIG. 6.

Figure 13:
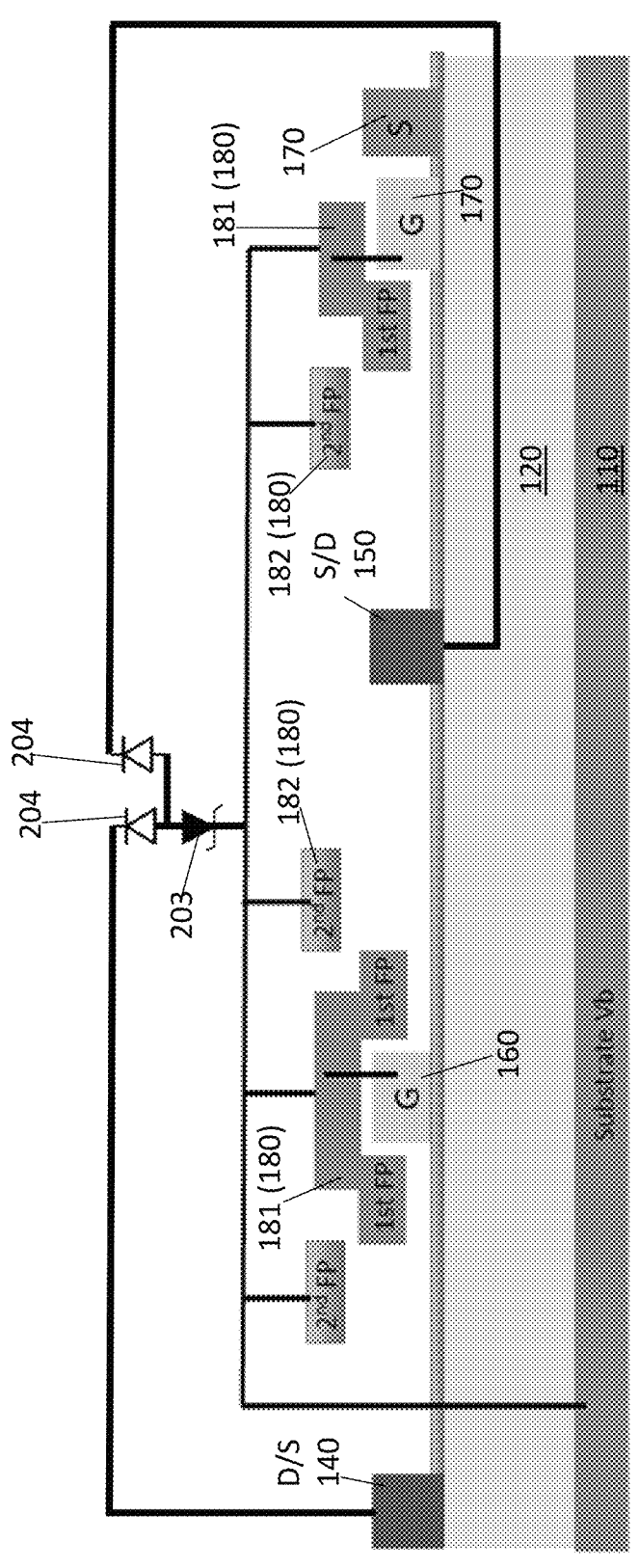
FIG. 13 is a cross-sectional view of a bidirectional enhancement mode GaN switch with gate protection circuitry in accordance with another embodiment of the present invention.

FIG. 13 is a cross-sectional view of a bidirectional enhancement mode GaN switch, similar to bidirectional enhancement mode GaN switch 400 shown in FIG. 6, with certain differences described below. Gate 160 is protected from overvoltage by a Zener diode 203 connected in series with two parallel high voltage diodes 204 connected between gate 160 and first ohmic power electrode 140 and between gate 160 and second ohmic power electrode 150. Again, a Schottky diode is preferred. The overvoltage protection may also be provided by a high voltage GaN FET. The two back-to-back diodes in in each drain-gate or source-gate path of the first sub-switch can be integrated, co-packed, and/or external.

Figure 14:
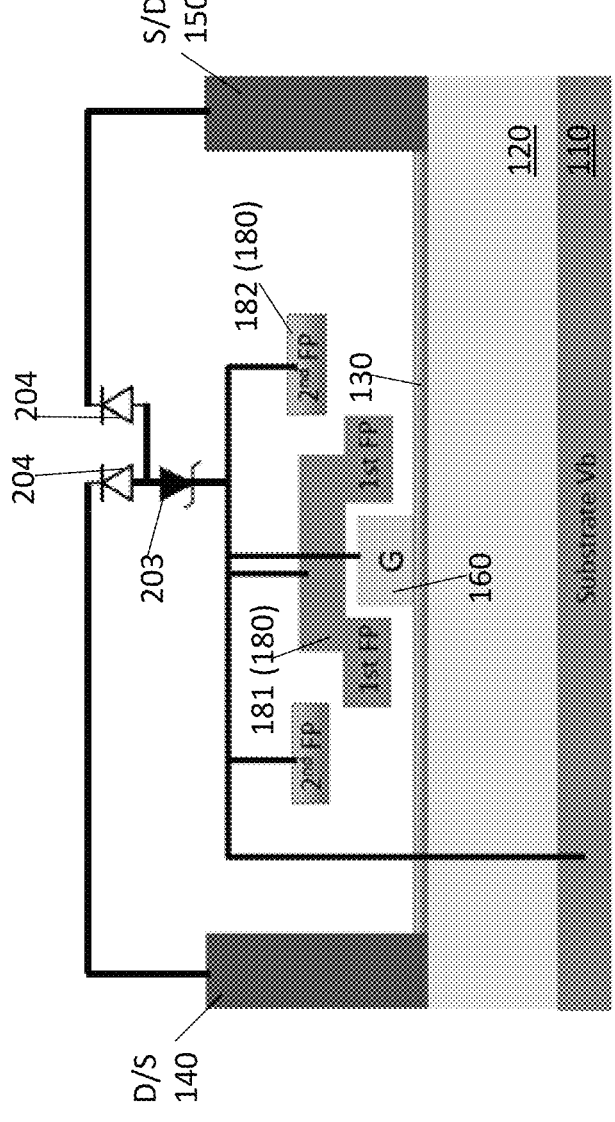
FIG. 14 is a cross-sectional view of the first sub-switch of the bidirectional enhancement mode GaN switch of FIG. 13.

FIG. 14 is a cross-sectional view of the first sub-switch of the bidirectional enhancement mode GaN switch of FIG. 13.

Figure 15:
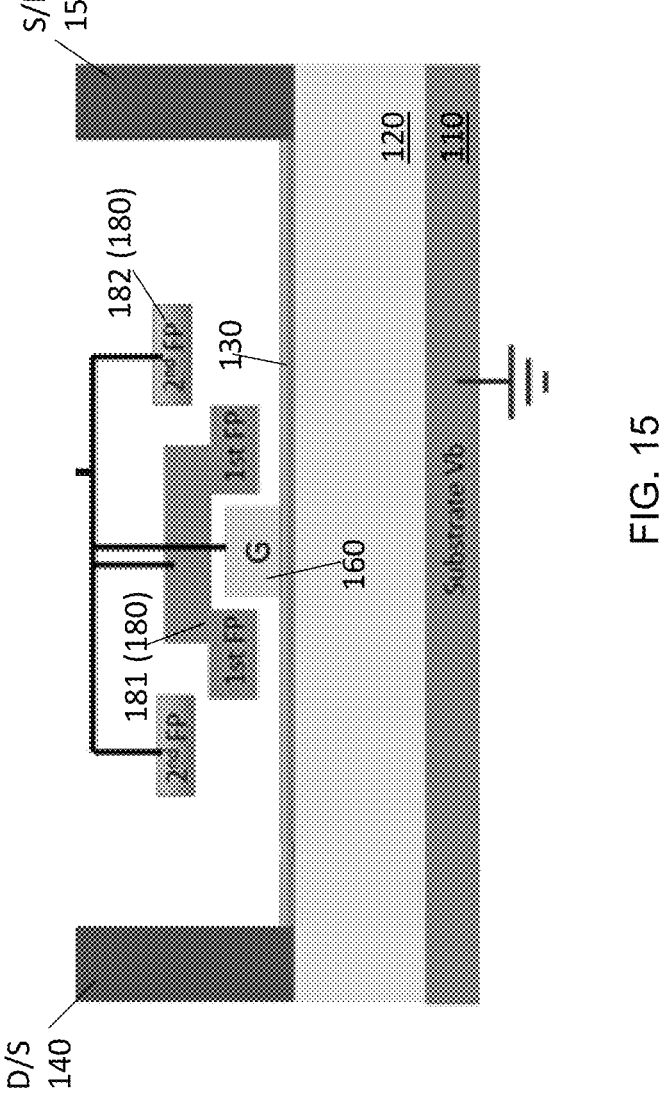
FIG. 15 is a cross-sectional view of a first sub-switch which is similar to the first sub-switch of bi-directional enhancement-mode GaN switch shown in FIG. 6, except the substrate is electrically grounded, rather than being electrically shorted to gate 160.

FIG. 15 is a cross-sectional view of a first sub-switch which is similar to the first sub-switch of bi-directional enhancement-mode GaN switch 400 shown in FIG. 6, except that, in FIG. 15, the substrate 110 is electrically grounded, rather than being electrically shorted to gate 160.

Figure 16:
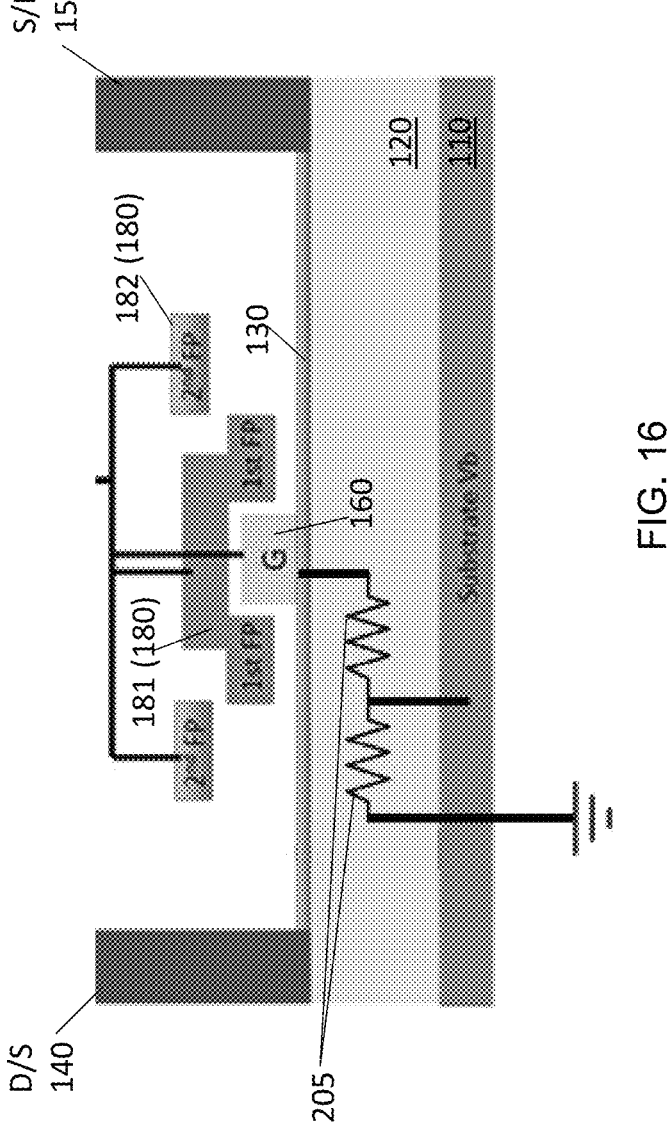
FIG. 16 is a cross-sectional view of a first sub-switch which is similar to the first sub-switch of the bi-directional enhancement-mode GaN switch shown in FIG. 6, except that the potential of the substrate 110 follows the gate 160 at a lower controlled voltage through a voltage divider 205.

FIG. 16 is a cross-sectional view of a first sub-switch which is similar to the first sub-switch of the bi-directional enhancement-mode GaN switch 400 shown in FIG. 6, except that, in FIG. 16, the potential of the substrate 110 follows the gate 160 at a lower controlled voltage through a voltage divider 205. This minimizes the hole injection and trapping in the buffer during the fault condition with high Vgd that would otherwise cause high off-state leakage between the ohmic power electrode 140 and the ohmic power electrode 150 when the device turns off.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A bidirectional GaN FET switch with a single gate, comprising:

a substrate, a GaN layer on the substrate, an AlGaN layer on the GaN layer, a first power electrode and a second power electrode, a third power electrode and a gate, wherein the bidirectional GaN FET switch is formed of a first sub-switch and a second sub-switch integrated together in the bidirectional GaN FET switch on a die having an area and connected in parallel in an equivalent circuit, wherein:

the first sub-switch comprises a single gate GaN field effect transistor (FET), wherein the first and the second power electrodes serve as source/drain electrodes and wherein the gate is centrally located between the first and second power electrodes, whereby the gate is spaced an equal distance from the first and second power electrodes;

the second sub-switch comprises a first GaN FET and a second GaN FET connected in a back-to-back configuration having a common gate, wherein the third power electrode acts as a common source, and wherein the first power electrode and the second power electrode serve as the respective drain electrode of the first GaN FET and the second GaN FET; and the gate of the single gate GaN FET of the first sub-switch is electrically connected to the common gate of the first and second back-to-back GaN FETs of the second sub-switch to form the single gate of the bidirectional GaN FET switch;

wherein the first sub-switch occupies most of the die area, and the second sub-switch occupies only a small percentage of the die area, such that current passing through the bidirectional GaN FET switch, when the switch is ON, flows primarily under the single gate of the first sub-switch.

2. The bidirectional GaN FET switch of claim 1, wherein the substrate is electrically connected to the single gate.

3. The bidirectional GaN FET switch of claim 1, wherein the substrate is electrically connected to the common source of the second sub-switch.

4. The bidirectional GaN FET switch of claim 1, further comprising at least one field plate, wherein the at least one field plate is connected to the common source of the second sub-switch.

5. The bidirectional GaN FET switch of claim 2, further comprising a protection circuitry between the common source of the second sub-switch and the single gate, which is electrically connected to the substrate, to protect the single gate from an overvoltage.

6. The bidirectional GaN FET switch of claim 1, wherein the substrate is electrically connected to the power electrodes of the first sub-switch by respective diodes.

7. The bidirectional GaN FET switch of claim 6, further comprising a Zener diode connected between each respective diode and the single gate of the bidirectional GaN FET switch to provide overvoltage protection for the single gate.

8. The bidirectional GaN FET switch of claim 1, wherein the substrate is electrically connected to the power terminals of the first sub-switch by an active circuit comprising a comparator connected to first and second transistors which are respectively connected between the first and second power electrodes and the substrate, wherein the comparator is configured to:

compare electrical potentials of the first and second power electrodes; and turn on the one of the first and second transistors corresponding to the power electrode having a lower potential.

9. The bidirectional GaN FET switch of claim 1, wherein the substrate is connected to ground.

10. The bidirectional GaN FET switch of claim 1, further comprising a voltage divider electrically connected between the single gate and ground, the voltage divider being electrically connected to the substrate, such that the substrate has a potential which follows a potential of the single gate at a fraction of the potential of the single gate.

\* \* \* \* \*